(12) United States Patent
Deleonibus

(10) Patent No.: US 7,466,019 B2
(45) Date of Patent: Dec. 16, 2008

(54) RECTANGULAR SEMI-CONDUCTING SUPPORT FOR MICROELECTRONICS AND METHOD FOR MAKING SAME

(75) Inventor: Simon Deleonibus, Claix (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 11/667,920

(22) PCT Filed: Nov. 24, 2005

(86) PCT No.: PCT/FR2005/002923

§ 371 (c)(1),
(2), (4) Date: May 17, 2007

(87) PCT Pub. No.: WO2006/058984

PCT Pub. Date: Jun. 8, 2006

(65) Prior Publication Data

US 2008/0001274 A1    Jan. 3, 2008

(30) Foreign Application Priority Data

Nov. 30, 2004   (FR) ................... 04 12699

(51) Int. Cl.
*H01L 23/06* (2006.01)
(52) U.S. Cl. .......... 257/684; 257/77; 257/705; 257/713; 257/E23.11; 438/105
(58) Field of Classification Search ........... 257/684, 257/E23.11
See application file for complete search history.

(56) References Cited

U.S. PATENT DOCUMENTS 3,961,997 A    6/1976    Chu 4,466,938 A *  8/1984    Gigl et al. .............. 264/332

(Continued)

FOREIGN PATENT DOCUMENTS

DE    25 36 174 A1    3/1977

(Continued)

OTHER PUBLICATIONS

Schonecker et al., "Ribbon-Growth-on-Substrate: Progress in High Speed Crystalline Silicon Wafer Manufacturing," 29th IEEE Photovoltaic Specialists Conference, New Orleans, USA, May 22-24, 2002.

(Continued)

*Primary Examiner*—Tu-Tu V Ho
(74) *Attorney, Agent, or Firm*—Oliff & Berridge, PLC

(57) ABSTRACT

The semi-conducting support comprises a graphite substrate having a front surface and a rear surface and at least a first stack arranged on the front surface of the substrate. The first stack successively comprises a single-crystal diamond layer, an electrically insulating oxide layer and a semi-conducting layer. The support can comprise a second stack arranged on the rear surface of the substrate and comprising the same succession of layers as the first stack or comprising a polymer material layer. A thermal connection passing through the first and/or second stacks and connecting the graphite substrate to an external surface of the support enables heat to be removed. The method can comprise production of the semi-conducting layer by molecular bonding of rectangular silicon strips onto the oxide layer.

30 Claims, 2 Drawing Sheets

U.S. PATENT DOCUMENTS

| | | | | |
|---|---|---|---|---|
| 5,391,895 | A | * | 2/1995 | Dreifus .................. 257/77 |
| 6,099,966 | A | | 8/2000 | Bak-Boychuk et al. |
| 2004/0256624 | A1 | * | 12/2004 | Sung ..................... 257/77 |
| 2005/0029224 | A1 | * | 2/2005 | Aspar et al. ............. 216/33 |

FOREIGN PATENT DOCUMENTS

EP        0 689 244 A2    12/1995

OTHER PUBLICATIONS

Schonecker et al., "Ribbon-Growth-on-Substrate: Status, Challenges and Promises of High Speed Silicon Wafer Manufacturing," 12th Workshop on Crystalline Silicon Solar Cells, Materials and Processes, 2002.

Khattak et al., "Current Status of HEM Grown Silicon Ingots," NREL/SNL Photovoltaics, Program Review Meeting, Lakeview CO, USA, Nov. 18-22, 1996.

* cited by examiner

RECTANGULAR SEMI-CONDUCTING SUPPORT FOR MICROELECTRONICS AND METHOD FOR MAKING SAME

BACKGROUND OF THE INVENTION

The invention relates to a semi-conducting support for microelectronics.

STATE OF THE ART

Generally, semi-conducting supports used for microelectronics are circular and the support processing machines are adapted to the diameter of the supports. Thus, when the diameter of the supports is increased with the aim of increasing productivity, the processing machines have to be replaced, which represents large costs. In addition, the circular shape of the semi-conducting supports makes processing of the supports difficult and therefore limits the production rate.

Semi-conducting supports are in most cases silicon supports. With these supports, it is difficult to achieve double-sided components, i.e. components comprising electronic elements on both surfaces, in particular their front and rear surfaces. The main problem is the mechanical strength of silicon. A silicon support is in fact liable to break when electronic elements are realized on both its surfaces. Moreover, silicon presents more favorable electronic properties for producing electronic elements than materials that have better mechanical qualities, such as graphite which is used for example for solar cells.

Furthermore, the amount of heat generated by integrated circuits increases with the power of the circuits which is increasing all the time. Heat dissipation is therefore becoming an increasingly important problem.

OBJECT OF THE INVENTION

One object of the invention is to remedy these shortcomings and, in particular, to propose a semi-conducting support enabling heat to be removed, which support can comprise electronic elements on the front surface and on the rear surface thereof.

According to the invention, this object is achieved by the accompanying claims, and more particularly by the fact that the semi-conducting support comprises a rectangular graphite substrate having a front surface and a rear surface, support comprising at least a first stack arranged on the front surface of the substrate, successively comprising a monocrystalline diamond layer, an electrically insulating oxide layer and a semi-conducting layer.

It is a further object of the invention to provide a method for producing a semi-conducting support according to the invention successively comprising production of the diamond layer, deposition of the oxide layer on the diamond layer and production of the semi-conducting layer.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
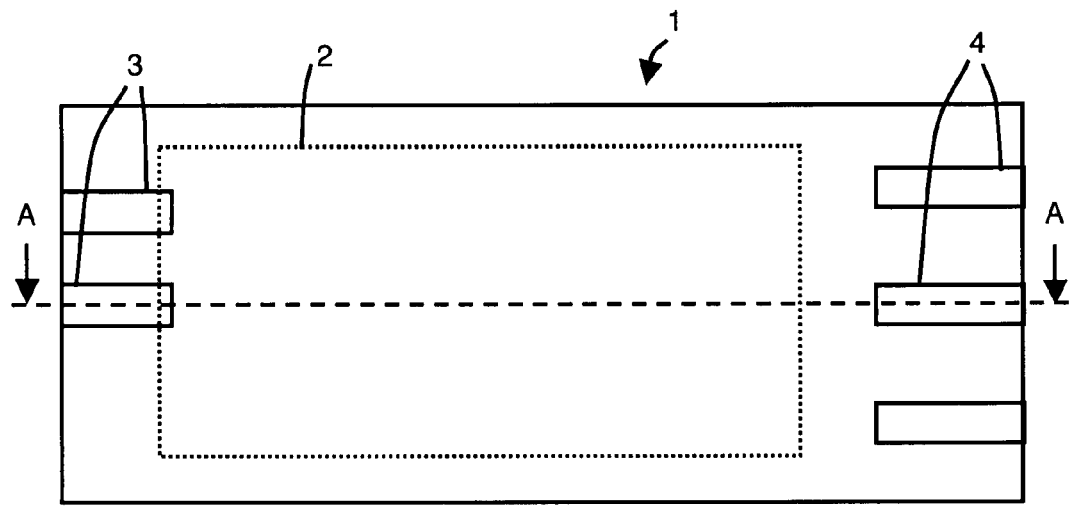
FIG. 1 is a top view of a particular embodiment of a rectangular semi-conducting support according to the invention.

FIG. 1 illustrates a front surface of a rectangular semi-conducting support 1 comprising at least one integrated circuit in a semi-conducting layer 2. The integrated circuit can be electrically connected to the rear surface of the support 1 by means of electrical connections 3 passing through the support 1. In addition, the support 1 can comprise heat sinks 4 arranged on an external surface of the support 1, for example on the front surface as represented, and connected to internal layers of the support 1 by means of a thermal connection, enabling the internal layers to be cooled when the integrated circuit is operating. The thermal connections can be connected to external cold sources. The support can also comprise electrical connection pads to connect the integrated circuit to external devices.

Figure 2:
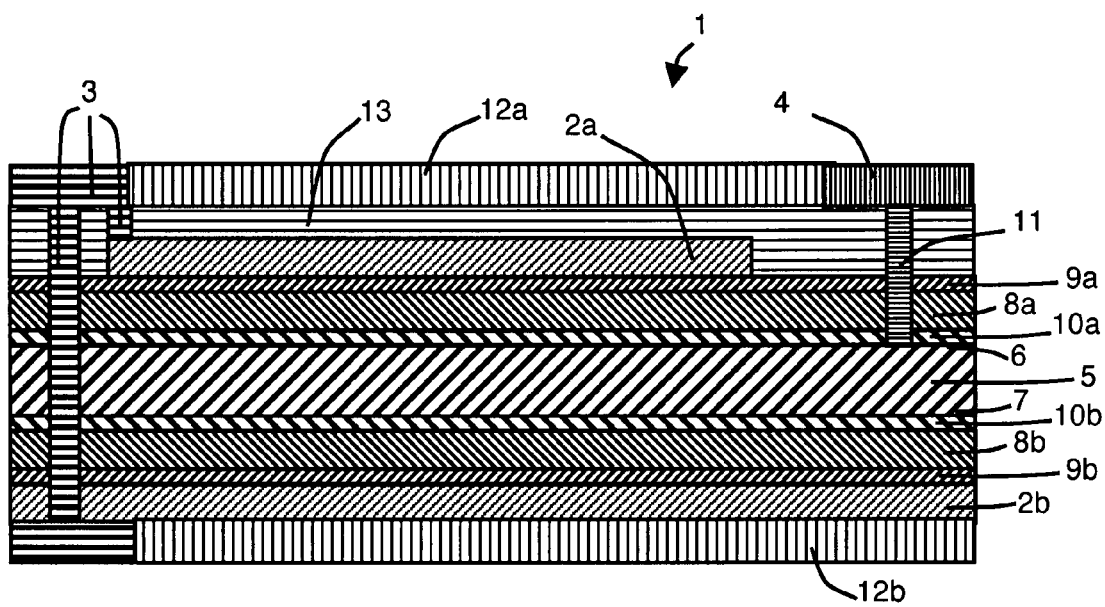
FIGS. 2 and 3 represent two particular embodiments of a rectangular semi-conducting support according to the invention, in cross-section along the line A-A of FIG. 1.

The support 1 represented in FIG. 2 comprises a graphite substrate 5 having a front surface 6 and a rear surface 7, respectively arranged at the top and bottom in FIG. 2. The support 1 comprises a first stack, arranged on the front surface 6 of the substrate 5 and successively comprising a single-crystal diamond layer 8a, an electrically insulating oxide layer 9a and a semi-conducting layer 2a. As diamond and graphite are very good thermal conductors, the support according to the invention limits heating of the support when the integrated circuit arranged in the semi-conducting layer 2 is in operation.

The oxide layer 9a and the semi-conducting layer 2a thus form a SOI (Silicon On Insulator) structure comprising a buried oxide under a semi-conductor.

In the particular embodiment represented in FIG. 2, the support 1 comprises a second stack arranged on the rear surface 7 of the substrate 5, successively comprising a single-crystal diamond layer 8b, an electrically insulating oxide layer 9b and a semi-conducting layer 2b. The oxide layer 9a and/or the oxide layer 9b is/are preferably thermally conducting and can for example have a thermal resistance close to that of the diamond layers 8a or 8b.

As represented in FIG. 2, the support 1 can comprise an additional layer 10 arranged between the substrate 5 and the first and/or second stacks. In FIG. 2 for example, the additional layer 10a is arranged between the substrate 5 and the diamond layer 8a of the first stack and the additional layer 10b is arranged between the substrate 5 and the diamond layer 8b of the second stack. The additional layer 10 can for example be insulating, for example made from alumina, or metallic, for example made from nickel, platinum or iridium. The layers 10a and 10b are nucleation layers for the diamond.

The oxide layers 9a and/or 9b comprise for example one or more compounds selected among alumina $Al_2O_3$, barium and strontium titanate $BaSrTiO_3$, hafnium oxide $HfO_2$, lanthanum oxide $La_2O_3$ and rare earth oxides, for example lanthanide oxides such as lutetium oxide $Lu_2O_3$ and gadolinium oxide $Gd_2O_3$. In a particular embodiment, each oxide layer is formed by an alternation of layers of $Al_2O_3$ and/or $HfO_2$ and/or a rare earth oxide, so as to minimize the interface state density while preserving a good thermal conductivity.

As represented in FIG. 2, the support 1 can comprise an electrical connection 3 passing through the substrate 5 and connecting the semi-conducting layer 2a of the first stack to the second stack, for example to the semi-conducting layer 2b of the second stack.

In FIG. 2, the support 1 comprises a thermal connection 11 passing through the first stack and thermally connecting the graphite substrate 5 to an external surface of the support 1, in particular to the heat sink 4 arranged on the front surface of the support 1 and connected to the thermal connection 11. Thermal connections 11 passing through the second stack and thermally connecting the substrate 5 to the rear surface of the support 1 can also be envisaged.

The support 1 preferably comprises a passivation layer 12 arranged on the semi-conducting layer 2 and providing both a mechanical and thermal protection. The passivation layer 12 and the semi-conducting layer 2 can be separated by an insulating layer 13 as represented in FIG. 2 for the layers 2a and 12a.

Figure 3:
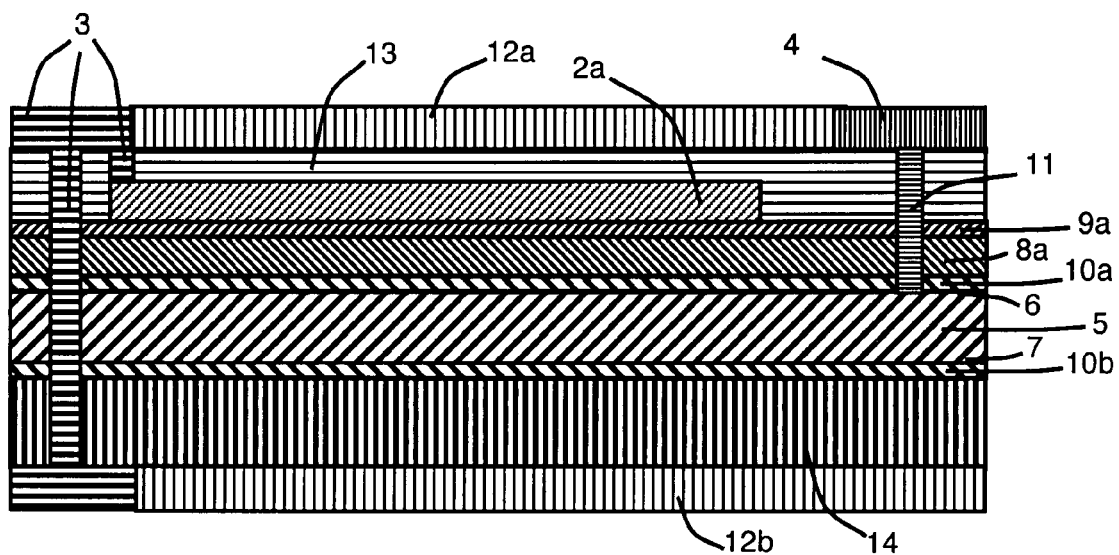

In the particular embodiment represented in FIG. 3, the support 1 comprises, as before, a second stack arranged on the rear surface 7 of the substrate 5. In this embodiment, the second stack comprises a layer 14 made of polymer material, arranged between the passivation layer 12b and the additional layer 10b. This enables a flat screen on polymer film to be integrated on the rear surface of the support 1, the electronic signal and data processing part being on the front surface of the support 1, connected with the screen by means of pass-through electric connections 3. A very flat micro-computer can thus be achieved.

In another embodiment, there can be a stack of a semi-conducting 2b layer and of an oxide layer 9b, and advantageously of a single-crystal diamond layer 8b, between the layers 10b and 14. The function of the semi-conducting layer 2b is to enable connection with a line-column addressing transistor. The single-crystal diamond layer 8b, like the diamond layer 8a, has the function of cooling the adjacent layers.

A method for producing a semi-conducting support 1 according to the invention successively comprises production of the diamond layer 8, deposition of the oxide layer 9 on the diamond layer 8 and production of the semi-conducting layer 2. The diamond layer 8 is for example achieved by plasma deposition, by chemical vapor deposition (CVD) or by epitaxy, directly on the graphite substrate 5 or on an additional nucleation layer 10. The diamond layers 8a and 8b are preferably produced at the same time.

The semi-conducting layer 2 can be achieved by molecular bonding of rectangular silicon strips or sheets onto the oxide layer 9. The rectangular silicon strips are preferably achieved by a Ribbon Growth on Substrate (RGS) technique or by a Heat Exchange Method (HEM) technique. The RGS and HEM technique are conventionally used for fabrication of substrates for poly-crystalline silicon solar cells. The RGS technique consists in depositing a silicon strip on a substrate from a molten silicon tank, as described in the article "Ribbon-Growth-on-Substrate: Progress in High-Speed Crystalline Silicon Wafer Manufacturing" by A. Schönecker et Al. (29th IEEE Photovoltaic Specialists Conference, 20-24 May 2002, New Orleans, USA) and in the article "Ribbon-Growth-on-Substrate: Status, Challenges and Promises of High Speed Silicon Wafer Manufacturing" by A. Schönecker et Al. (12th Workshop on Crystalline Silicon Solar Cells, Materials and Processes, 2002). The HEM technique consists in fabricating a cubical silicon ingot from a molten bath, as described in the article "Current Status of HEM Grown Silicon Ingots" by C. P. Khattak et Al. (NREL/SNL Photovoltaics Program Review Meeting, Lakeview, Colo., November 1996).

To obtain a semi-conducting layer 2 having very good crystalline qualities, the latter can for example be produced by Molecular Beam Epitaxy (MBE) of a semi-conducting material or by chemical vapor deposition (CVD). A laser may be used to recrystallize the semi-conducting material. The semi-conducting material can for example be silicon (Si), germanium (Ge), diamond-like carbon (C), gallium arsenide (GaAs) or a compound containing indium and phosphorus. These materials are advantageously deposited on an oxide layer 9 having a high dielectric constant (High-K).

The integrated circuits can then be achieved in the semi-conducting layer 2. The support according to the invention can support fairly high temperatures allowing all integrated circuit production techniques.

A support 1 comprising a layer 14 of polymer material on its rear surface can be produced from a support 1 comprising the same succession of layers on its rear surface as on its front surface, in particular at least one diamond layer 8, an oxide layer 9 and a semi-conducting layer 2. The layers disposed on the rear surface of the support 1 can be removed by polishing of the rear surface of the support 1 and the layer 14 of polymer material can then be deposited on the rear surface of the support 1. When the support comprises an additional layer 10b, disposed on the rear surface 7 of the substrate 5, polishing can be stopped on this additional layer 10b. If the support does not comprise an additional layer 10b, a nucleation layer, for example made of alumina, can be deposited on the rear surface 7 of the substrate 5, before the polymer material layer 14 is deposited.

Polishing of the rear surface of the support 1 is preferably performed by chemical mechanical polishing or by friction on a conveyor belt, the support 1 being held by a suction system on the conveyor belt. The mechanical strength of the support 1 is ensured by the graphite substrate 5 of sufficient thickness. The electronic part can be achieved, before or after polishing, in the semi-conducting layer 2a arranged on the front surface of the support 1.

Other electronic elements can be achieved on the rear surface of the support 1, for example all the passive electronic components necessary for mobile telephony for receipt, transmission and vocal synthesis.

The electronic components arranged on the rear surface of the support 1 are advantageously produced after the passivation layer 12a has been placed on the front surface of the support 1. It is in this way possible to turn the support 1 and to achieve the electronic components on the rear surface by means of conventional collective fabrication steps, the support 1 being placed on its front surface. Cutting of the components is only performed after all the electronic components have been achieved on the front and rear surface, so as to minimize production costs.

The support 1 according to the invention can for example have a length of about 2 m and a width of about 0.1 m. The support according to the invention is in particular suitable for producing very high-performance passive or active electronic systems (electronic circuits). The materials used, such as diamond, graphite and alumina, do in fact have a lower dielectric constant than that of silicon, and the dielectric losses due to the support are therefore minimized. The cost of such active or passive components is then reduced.

The invention claimed is:

1. A semi-conducting support for microelectronics, comprising:
   a rectangular graphite substrate having a front surface and a rear surface;
   at least one semi-conducting layer arranged on the front surface of the substrate;
   at least a first stack arranged on the front surface of the substrate and successively comprising a single-crystal diamond layer, an electrically insulating oxide layer having a high dielectric constant and the semi-conducting layer; and
   a second stack arranged on the rear surface of the substrate, the second stack successively comprising a single-crystal diamond layer, an electrically insulating oxide layer having a high dielectric constant and a semi-conducting layer.

2. A semi-conducting support for microelectronics, comprising:
   a rectangular graphite substrate having a front surface and a rear surface;
   at least one semi-conducting layer arranged on the front surface of the substrate;
   at least a first stack arranged on the front surface of the substrate and successively comprising a single-crystal diamond layer, an electrically insulating oxide layer having a high dielectric constant and the semi-conducting layer; and
   a second stack arranged on the rear surface of the substrate, the second stack comprising at least one polymer material layer.

3. A semi-conducting support for microelectronics, comprising:
   a rectangular graphite substrate having a front surface and a rear surface;
   at least one semi-conducting layer arranged on the front surface of the substrate;
   at least a first stack arranged on the front surface of the substrate and successively comprising a single-crystal diamond layer, an electrically insulating oxide layer having a high dielectric constant and the semi-conducting layer;
   a second stack arranged on the rear surface of the substrate, the second stack successively comprising a single-crystal diamond layer, an electrically insulating oxide layer having a high dielectric constant and a semi-conducting layer; and
   at least one electrical connection passing through the substrate and connecting the semi-conducting layer of the first stack to the second stack.

4. A semi-conducting support for microelectronics, comprising:
   a rectangular graphite substrate having a front surface and a rear surface;
   at least one semi-conducting layer arranged on the front surface of the substrate;
   at least a first stack arranged on the front surface of the substrate and successively comprising a single-crystal diamond layer, an electrically insulating oxide layer having a high dielectric constant and the semi-conducting layer;
   a second stack arranged on the rear surface of the substrate, the second stack successively comprising a single-crystal diamond layer, an electrically insulating oxide layer having a high dielectric constant and a semi-conducting layer; and
   an additional insulating layer disposed between the substrate and at least one of the first and second stacks.

5. A semi-conducting support for microelectronics, comprising:
   a rectangular graphite substrate having a front surface and a rear surface;
   at least one semi-conducting layer arranged on the front surface of the substrate;
   at least a first stack arranged on the front surface of the substrate and successively comprising a single-crystal diamond layer, an electrically insulating oxide layer having a high dielectric constant and the semi-conducting layer;
   a second stack arranged on the rear surface of the substrate, the second stack successively comprising a single-crystal diamond layer, an electrically insulating oxide layer having a high dielectric constant and a semi-conducting layer; and
   an additional metallic layer disposed between the substrate and at least one of the first and second stacks.

6. The support according to claim 1, wherein the oxide layer comprises at least one compound selected among $Al_2O_3$, $BaSrTiO_3$, $HfO_2$, $La_2O_3$ and rare earth oxides.

7. The support according to claim 6, wherein the oxide layer is formed by an alternation of layers comprising any of $Al_2O_3$, $HfO_2$ and a rare earth oxide.

8. A semi-conducting support for microelectronics, comprising:
   a rectangular graphite substrate having a front surface and a rear surface;
   at least one semi-conducting layer arranged on the front surface of the substrate;
   at least a first stack arranged on the front surface of the substrate and successively comprising a single-crystal diamond layer, an electrically insulating oxide layer having a high dielectric constant and the semi-conducting layer;
   a second stack arranged on the rear surface of the substrate, the second stack successively comprising a single-crystal diamond layer, an electrically insulating oxide layer having a high dielectric constant and a semi-conducting layer; and
   at least one thermal connection passing through at least one of the first and second stacks and connecting the graphite substrate to an external surface of the support.

9. The support according to claim 8, further comprising at least one heat sink arranged on the external surface of the support and connected to the thermal connection.

10. The support according to claim 1, further comprising a passivation layer arranged on the semi-conducting layer.

11. The support according to claim 1, wherein at least one of the electrically insulating oxide layers is thermally conducting.

12. A method for making a semi-conducting support according to claim 2, successively comprising:
   producing the diamond layer;
   depositing the oxide layer on the diamond layer;
   producing the semi-conducting layer;
   polishing the rear surface of the support; and
   depositing a polymer material layer on the rear surface of the support.

13. The support according to claim 2, wherein the oxide layer comprises at least one compound selected among $Al_2O_3$, $BaSrTiO_3$, $HfO_2$, $La_2O_3$ and rare earth oxides.

14. The support according to claim 13, wherein the oxide layer is formed by an alternation of layers comprising any of $Al_2O_3$, $HfO_2$ and a rare earth oxide.

15. The support according to claim 2, further comprising a passivation layer arranged on the semi-conducting layer.

16. The support according to claim 2, wherein at least one of the electrically insulating oxide layers is thermally conducting.

17. The support according to claim 3, wherein the oxide layer comprises at least one compound selected among $Al_2O_3$, $BaSrTiO_3$, $HfO_2$, $La_2O_3$ and rare earth oxides.

18. The support according to claim 17, wherein the oxide layer is formed by an alternation of layers comprising any of $Al_2O_3$, $HfO_2$ and a rare earth oxide.

19. The support according to claim 3, further comprising a passivation layer arranged on the semi-conducting layer.

20. The support according to claim 3, wherein at least one of the electrically insulating oxide layers is thermally conducting.

21. The support according to claim 4, wherein the oxide layer comprises at least one compound selected among $Al_2O_3$, $BaSrTiO_3$, $HfO_2$, $La_2O_3$ and rare earth oxides.

22. The support according to claim 21, wherein the oxide layer is formed by an alternation of layers comprising any of $Al_2O_3$, $HfO_2$ and a rare earth oxide.

23. The support according to claim 4, further comprising a passivation layer arranged on the semi-conducting layer.

24. The support according to claim 4, wherein at least one of the electrically insulating oxide layers is thermally conducting.

25. The support according to claim 5, wherein the oxide layer comprises at least one compound selected among $Al_2O_3$, $BaSrTiO_3$, $HfO_2$, $La_2O_3$ and rare earth oxides.

26. The support according to claim 25, wherein the oxide layer is formed by an alternation of layers comprising any of $Al_2O_3$, $HfO_2$ and a rare earth oxide.

27. The support according to claim 5, further comprising a passivation layer arranged on the semi-conducting layer.

28. The support according to claim 5, wherein at least one of the electrically insulating oxide layers is thermally conducting.

29. The support according to claim 8, further comprising a passivation layer arranged on the semi-conducting layer.

30. The support according to claim 8, wherein at least one of the electrically insulating oxide layers is thermally conducting.

* * * * *